US012616010B2

(12) United States Patent
Wang et al.

(10) Patent No.: US 12,616,010 B2
(45) Date of Patent: Apr. 28, 2026

(54) METHOD FOR FORMING SEMICONDUCTOR STRUCTURES

(71) Applicant: Winbond Electronics Corp., Taichung City (TW)

(72) Inventors: Yu-Po Wang, Kaohsiung City (TW); Te-Hsuan Peng, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 434 days.

(21) Appl. No.: 18/476,754

(22) Filed: Sep. 28, 2023

(65) Prior Publication Data

US 2024/0321628 A1      Sep. 26, 2024

(30) Foreign Application Priority Data

Mar. 23, 2023      (TW) ................................. 112110887

(51) Int. Cl.
| | |
|---|---|
| *H01L 21/768* | (2006.01) |
| *H01L 21/027* | (2006.01) |
| *H01L 21/033* | (2006.01) |
| *H10D 84/01* | (2025.01) |
| *H10D 84/03* | (2025.01) |

(52) U.S. Cl.
CPC .... *H01L 21/76802* (2013.01); *H01L 21/0274* (2013.01); *H01L 21/0332* (2013.01); *H10D 84/0147* (2025.01); *H10D 84/038* (2025.01)

(58) Field of Classification Search
CPC ........... H01L 21/76802; H01L 21/0274; H01L 21/0332; H01L 21/0337; H01L 21/31144;

H01L 21/76816; H10D 84/0147; H10D 84/038; H10B 12/02; H10B 12/485
See application file for complete search history.

(56) References Cited

U.S. PATENT DOCUMENTS

| | | | | |
|---|---|---|---|---|
| 9,123,776 B2* | 9/2015 | Tsai | .................. | H01L 21/76816 |
| 9,159,730 B2* | 10/2015 | Kim | .................. | H10B 12/0335 |
| 2007/0099431 A1* | 5/2007 | Li | ....................... | H01L 21/3088 |
| | | | | 438/689 |

(Continued)

FOREIGN PATENT DOCUMENTS

CN            114002909 A        2/2022

*Primary Examiner* — Andres Munoz
(74) *Attorney, Agent, or Firm* — Muncy, Geissler, Olds & Lowe, P.C.

(57) ABSTRACT

A method for forming semiconductor structures is provided. The method includes forming a first patterning photoresist layer having a first opening on a first patterning layer, trimming the first patterning photoresist layer, transferring the first pattern of the trimmed first patterning photoresist layer to the first patterning layer, performing a first pattern reversal process to reverse the first pattern of the first patterning layer into the second opening, forming a second patterning layer in and on the second opening, forming a second patterning photoresist layer having a third opening on the second patterning layer, transferring the second pattern of the second patterning photoresist layer to a first stacking layer, performing a second pattern reversal process to reverse a third pattern between the second opening and the third opening into a fourth opening, and extending the fourth opening to the substrate.

20 Claims, 8 Drawing Sheets

(56)                 References Cited

U.S. PATENT DOCUMENTS

2008/0305635 A1 *   12/2008   Tsai  .................... H01L 21/0337
                                                       257/E21.24
2014/0170853 A1 *   6/2014   Shamma  ........... H01J 37/32449
                                                       156/345.28
2015/0140811 A1 *   5/2015   Huang  ................ H01L 21/0273
                                                       438/669
2015/0179435 A1 *   6/2015   Wu  .................... H01L 21/76802
                                                       438/702

* cited by examiner

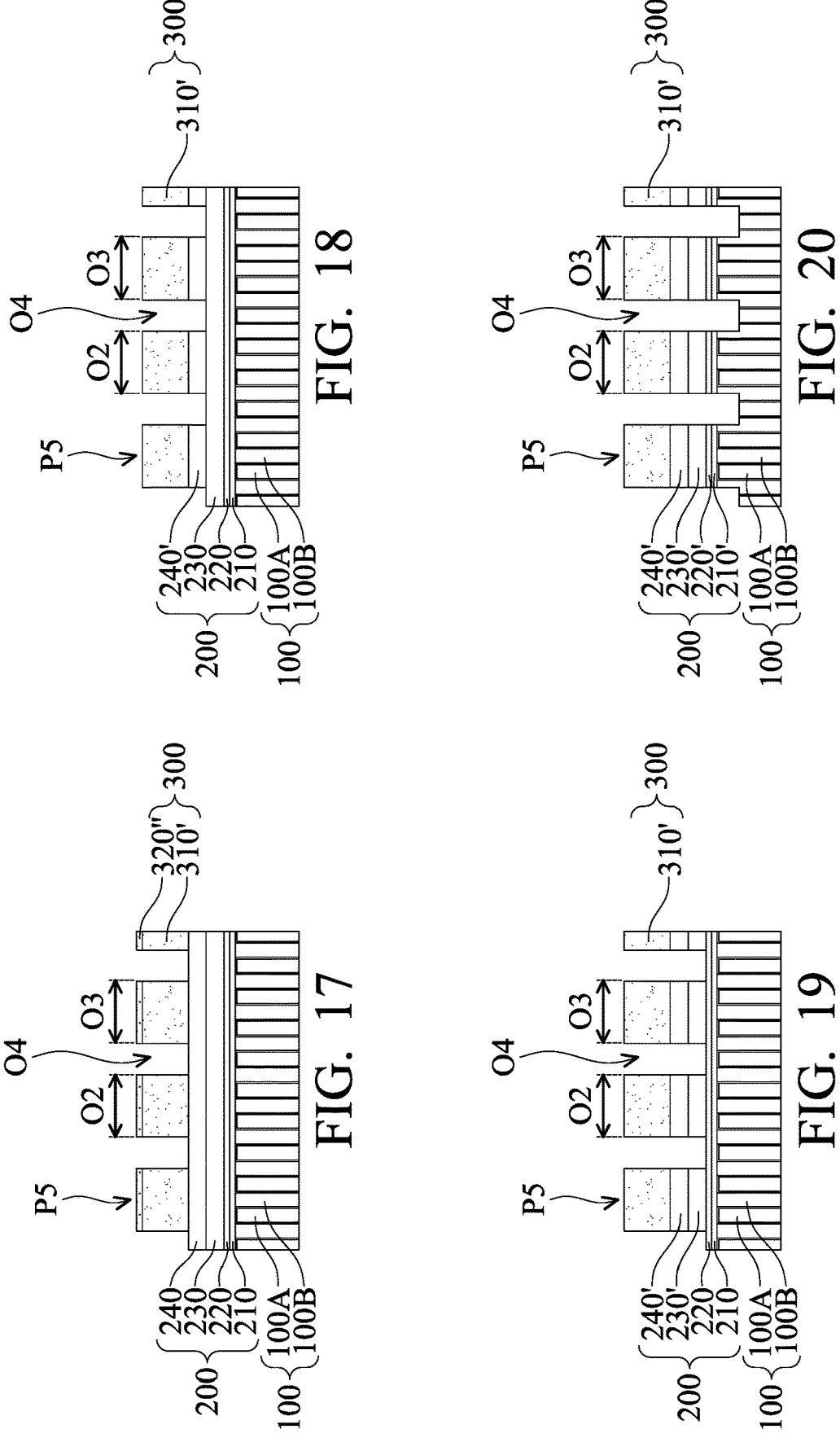

METHOD FOR FORMING SEMICONDUCTOR STRUCTURES

CROSS REFERENCE TO RELATED APPLICATIONS

This application claims priority of Taiwan Patent Application No. 112110887, filed on Mar. 23, 2023, the entirety of which is incorporated by reference herein.

BACKGROUND OF THE INVENTION

Field of the Invention

The present invention relates to a semiconductor structure, and, in particular, to a method of forming openings for bit line contacts and openings for drain contacts.

Description of the Related Art

Dynamic Random Access Memory (DRAM) devices are widely used in consumer electronics products. As component dimensions continue to shrink, many manufacturing challenges arise. For example, in the semiconductor manufacturing process, due to equipment limitations, it is difficult to form the openings of the bit line contacts and the openings of the drain contacts at the same time. Therefore, there is still a need to improve the method of manufacturing DRAM devices to overcome the problems caused by the scaling down of device sizes.

BRIEF SUMMARY OF THE INVENTION

An embodiment of the present invention provides a method for forming semiconductor structures. The method includes sequentially forming a first stacking layer and a first patterning layer on a substrate; forming a first patterning photoresist layer having a first opening on the first patterning layer; trimming the first patterning photoresist layer; transferring the first pattern of the trimmed first patterning photoresist layer to the first patterning layer; performing a first pattern reversal process to reverse the first pattern of the first patterning layer into the second opening; forming a second patterning layer in and on the second opening; forming a second patterning photoresist layer having a third opening on the second patterning layer; transferring the second pattern of the second patterning photoresist layer to the first stacking layer so that the first stacking layer has a second opening and a third opening; performing a second pattern reversal process to reverse the third pattern between the second opening and the third opening into a fourth opening and extending the fourth opening to the substrate. The second opening extends to the first stacking layer.

BRIEF DESCRIPTION OF THE DRAWINGS

The present invention can be more fully understood by reading the subsequent detailed description and examples with references made to the accompanying drawings, wherein:

FIGS. 1~22 shows cross-sectional views illustrating the formation of a semiconductor structure at different stages according to some embodiments of the present invention.

FIGS. 1-1, 2-1, 3-1, 9-1, 10-1, 12-1, 13-1, 14-1, 21-1, and 22-1 show top views corresponding to FIGS. 1, 2, 3, 9, 10, 12, 13, 14, 21, and 22.

DETAILED DESCRIPTION OF THE INVENTION

The following description is made for the purpose of illustrating the general principles of the invention and should not be taken in a limiting sense. The scope of the invention is best determined by reference to the appended claims.

Figures 1, 2:
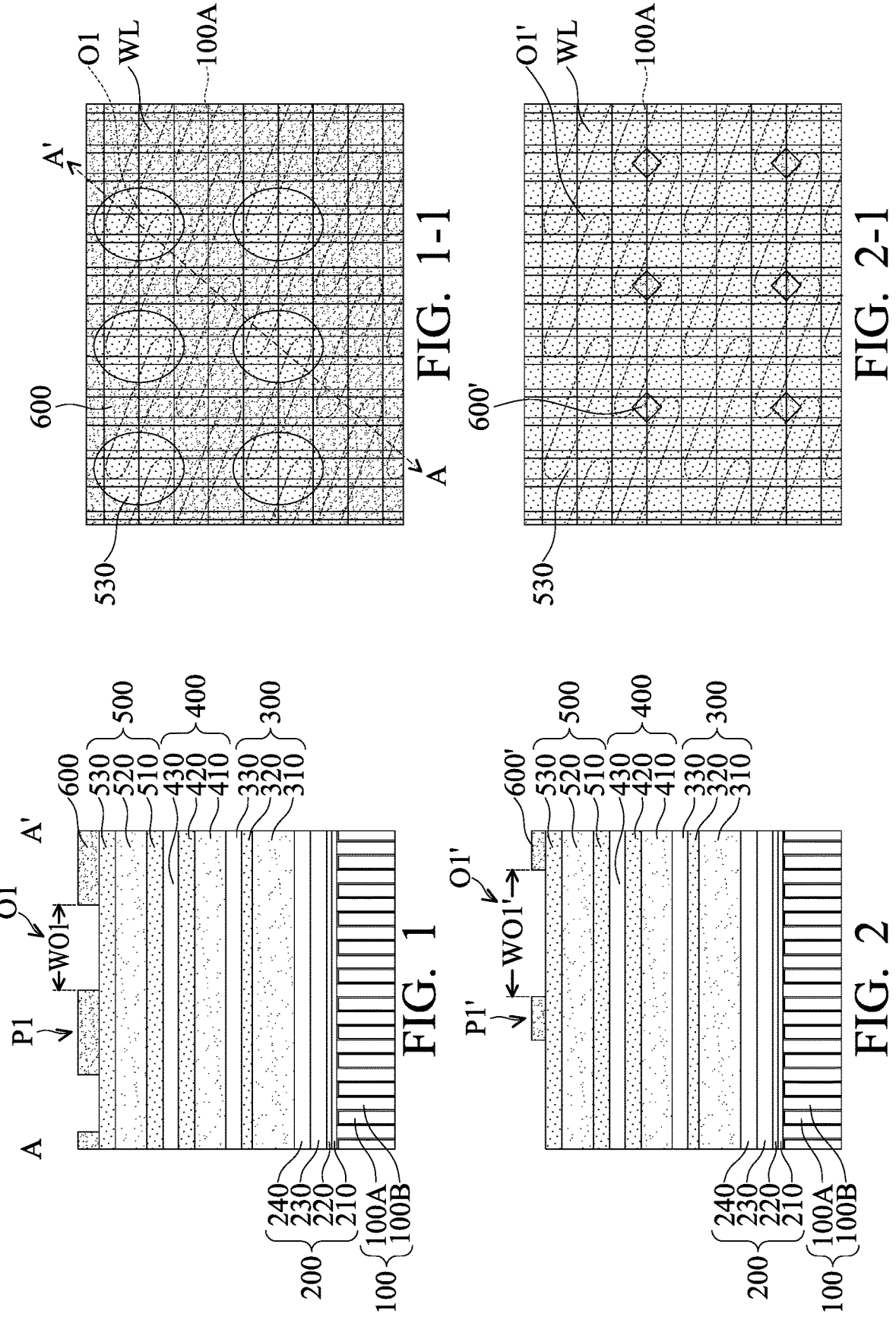

First, refer to FIG. 1 and FIG. 1-1. As shown in FIG. 1, a substrate 100 is provided. In general, a semiconductor-on-insulation substrate includes a layer of semiconductor material formed on an insulating layer. The insulating layer may be, for example, a buried oxide (BOX) layer, a silicon oxide layer or similar material, which provides an insulating layer on a silicon substrate or a glass substrate. In some embodiments, the substrate 100 includes active regions 100A and isolation regions 100B, which are arranged alternately with each other.

In some embodiments, word lines (not shown) are further buried in the semiconductor substrate. In some embodiments, the word line serves as a gate and includes a gate dielectric layer, a gate liner, and a gate electrode (not shown).

As shown in FIG. 1, a cap layer 200 is formed on the substrate 100 to protect the components in the substrate from being damaged by subsequent processes. In some embodiments, the cap layer 200 includes a nitride layer 210 formed on the substrate 100, an oxide layer 220 formed on the nitride layer 210, an active layer 230 formed on the oxide layer 220, an oxide layer 240 formed on the active layer 230. The nitride layer 210 prevents components in the substrate from being damaged by subsequent processes. A pair of the oxide layers 220 and 240 sandwich the active layer 230. The nitride layer 210 includes nitrogen-containing materials or nitrogen-based materials, such as silicon nitride (SiN), silicon oxynitride (SiON), and/or combinations thereof. The oxide layer 220 and the oxide layer 240 include oxygen-containing materials or oxygen-containing materials, such as silicon oxide (SiO), silicon oxynitride (SiON), and/or combinations thereof. The active layer 230 includes a conductive material, such as doped or undoped polycrystalline silicon, amorphous silicon, metal, metal nitride, conductive metal oxide, combinations thereof, or other suitable materials.

As shown in FIG. 1, a stacking layer 300 is formed on the cap layer 200. The stacking layer 300 includes a carbon-containing mask layer 310 formed on the cap layer 200 and oxygen-containing mask layers 320 and 330 formed on the carbon-containing mask layer 310. In some embodiments, the carbon-containing mask layer 310 includes carbon-containing materials or carbon-based materials, and the oxygen-containing mask layers 320 and 330 include oxygen-containing materials or oxygen-containing materials, such as silicon oxide (SiO), silicon oxynitride (SiON). The oxygen-containing mask layers 320 and 330 may respectively contain different oxygen ratios. For example, the oxygen-containing mask layer 320 is oxygen-rich silicon oxynitride (SiON), and the oxygen-containing mask layer 330 is silicon-rich silicon oxynitride (SiON).

As shown in FIG. 1, a stacking layer 400 is formed on stacking layer 300. In some embodiments, the composition of the stacking layer 400 is similar to that of the stacking layer 300, including a carbon-containing mask layer 410 formed on the stacking layer 300 and oxygen-containing mask layers 420 and 430 formed on the carbon-containing mask layer 410. The materials and formation of the carbon-containing mask layer 410 and the oxygen-containing mask layers 420 and 430 are similar to those of the carbon-containing mask layer 310 and the oxygen-containing mask layers 320 and 330, and will not be repeated here.

As shown in FIG. 1, a first patterning layer 500 is formed on the stacking layer 400. In some embodiments, the first patterning layer 500 includes oxygen-containing mask layers 510 and 530 formed on the stacking layer 400 and a carbon-containing mask layer 520 sandwiched therebetween. The oxygen-containing mask layers 510 and 530 are similar to the above-mentioned oxygen-containing mask layer 320, such as oxygen-rich silicon oxynitride (SiON), and the carbon-containing mask layer 520 is similar to the above-mentioned carbon-containing mask layer 310, such as highly selective transparent (HST) membrane and the like, and they will not be repeated here.

As shown in FIG. 1, a first patterning photoresist layer 600 is formed on the first patterning layer 500. In some embodiments, the first patterning photoresist layer 600 may be formed by a photolithography process using a mask. In FIG. 1, the first patterning photoresist layer 600 has a first pattern P1 and a first opening O1 exposing the underlying oxygen-containing mask layer 530. In FIG. 1, the first opening O1 has a width WO1.

As shown in FIG. 1-1, FIG. 1 corresponds to cross-section line AA' in FIG. 1-1. It should be noted that FIG. 1-1 only shows some components of the cross-sectional view shown in FIG. 1 to simplify the drawing. For brevity, the subsequent top view will omit the section line AA'. The first opening O1 of the first patterning photoresist layer 600 exposes the oxygen-containing mask layer 530. It can also be seen that the first patterning photoresist layer 600 surrounds the oxygen-containing mask layer 530. A word line WL is buried in the substrate 100 and extends along the first direction. In some embodiments, the word line serves as a gate and includes a gate dielectric layer, a gate liner, and a gate electrode (not shown). In some embodiments, the active region 100A extend in a way that is not parallel to the word line WL. For example, the active region 100A and the word line WL present an angle of about 20-80°, such as 40°, so as to improve the density of devices.

In some embodiments, with the word line WL as the center, a drain and a source are respectively disposed along two sides of the active region 100A. It can be seen from FIG. 1-1 that each active region 100A corresponds to two word lines WL. That is, along one side of each active region 100A to the other side, it may correspond to a drain, a gate, a source, a gate, and a drain. That is to say, two sets of transistor structures in the active region 100A share the same source, so that the layout may be more effectively used, thereby saving manufacturing cost. In some embodiments, the first opening O1 corresponds to the drain on one side of the active region 100A.

In this embodiment of the present invention, openings corresponding to both sides of the active region (drains) are firstly defined, and then openings of the bit line contacts (sources) are formed by a pattern reversal process. Details will be described below.

Next, refer to FIG. 2 and FIG. 2-1. As shown in FIG. 2, the first patterning photoresist layer 600 is trimmed. Specifically, the trimming includes etching the first patterning photoresist layer 600 by an isotropic etching process. After trimming, the height and the width of the first patterning photoresist layer 600 are reduced, and the first patterning photoresist layer 600 is denoted as 600'. That is, after trimming, the first pattern P1 is denoted as P1', and the first opening O1 is denoted as O1'. It can be seen from FIG. 2 that the height and width of the first pattern P1' are less than those of the first pattern P1. In FIG. 2, the first opening O1' has a width WO1' which is larger than the width WO1 of the first opening O1.

In some embodiments, the isotropic etching process spreads from the first opening O1 to all directions, so the first patterning photoresist layer 600' presents a rhombus or rhombus-like shape.

Figures 1, 3, 4, 5:
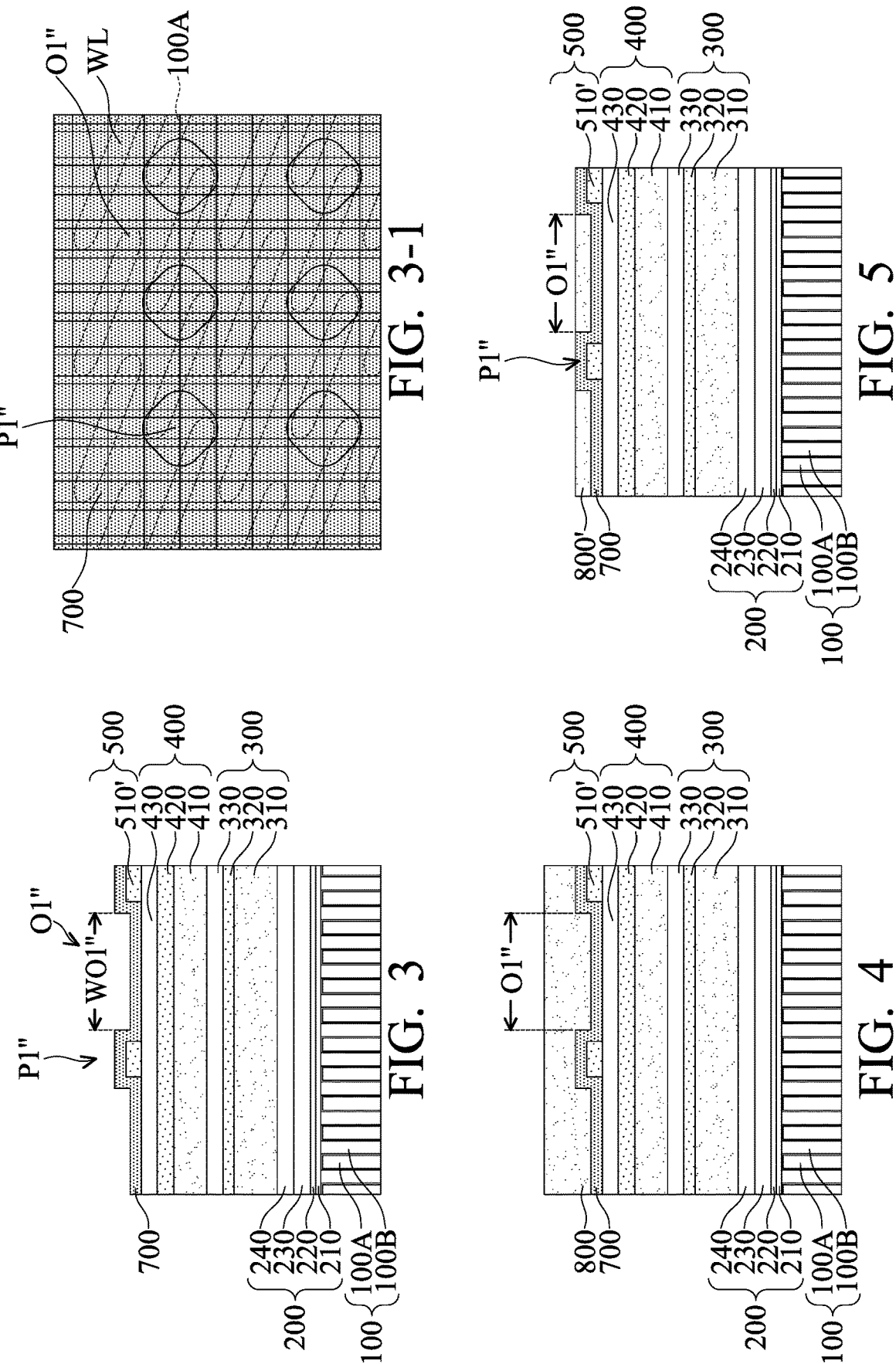

Next, refer to FIG. 3 and FIG. 3-1. As shown in FIG. 3, the first pattern P1' of the first patterning photoresist layer 600' is transferred to the oxygen-containing mask layer 510 of the first patterning layer 500, and the first patterning photoresist layer 600', the oxygen-containing mask layer 530 and the carbon-containing mask layer 520 are removed. The transferring includes using a highly selective etching process to transfer the first pattern P1 from the first patterning photoresist layer 600' to the oxygen-containing mask layer 510. After the transferring, the oxygen-containing mask layer 510 is denoted as 510'.

As shown in FIG. 3, the spacer material layer 700 is conformally formed on the first patterning layer 500 and on the first stacking layer 400. Specifically, the spacer material layer 700 is formed on the top surface and sidewalls of the oxygen-containing mask layer 510 and on the top surface of the oxygen-containing mask layer 430. The spacer material layer 700 includes oxygen-containing material or oxygen-based material, such as silicon oxide (SiO), and is formed by a deposition process. Here, the first pattern P1' including the spacer material layer 700 on both sidewalls is denoted as P1", and the first opening O1' between the sidewalls of the spacer material layer 700 is denoted as O1". In FIG. 3, the first opening O1" has a width WO1" which is less than the width WO1' of the first opening O1'.

In the embodiment of the present invention, the width of the subsequently formed second opening may be controlled through the trimming and the thickness of the spacer material layer 700. For example, the first pattern P1" is defined by the thickness of the spacer material layer 700 and the oxygen-containing mask layer 510', and the first pattern P1" will be reversed into a second opening by a pattern reversal process.

As shown in FIG. 3-1, the spacer material layer 700 covers the first opening O1" and the first pattern P1". It should be noted that since the first patterning photoresist layer 600' exhibits a rhombus or rhombus-like shape (referring to FIG. 2-1), after the spacer material layer 700 are deposited on both sides of the first patterning photoresist layer 600', the first pattern P1" also presents a rhombus or rhombus-like shape (referring to FIG. 3-1), which is rounded than the first patterning photoresist layer 600'.

Next, referring to FIGS. 4-9 and 9-1, a first pattern reversal process is performed to reverse the first pattern P1" of the oxygen-containing mask layer 510' into a second opening O2.

As shown in FIG. 4, a carbon-containing material layer 800 is formed on the spacer material layer 700. In some embodiments, the carbon-containing material layer 800 is a carbon-containing or carbon-based material.

As shown in FIG. 5, the excess portions of the carbon-containing material layer 800 are removed to expose the spacer material layer 700. In some embodiments, the carbon-containing material layer 800 on the spacer material layer 700 may be removed by a planarization process or an etch-back process, and the carbon-containing material layer 800 between the sidewalls of the spacer material layer 700 (or in the first opening O1") remains. After the removal, the carbon-containing material layer 800 is denoted as 800'.

Figures 6, 7, 8, 9:
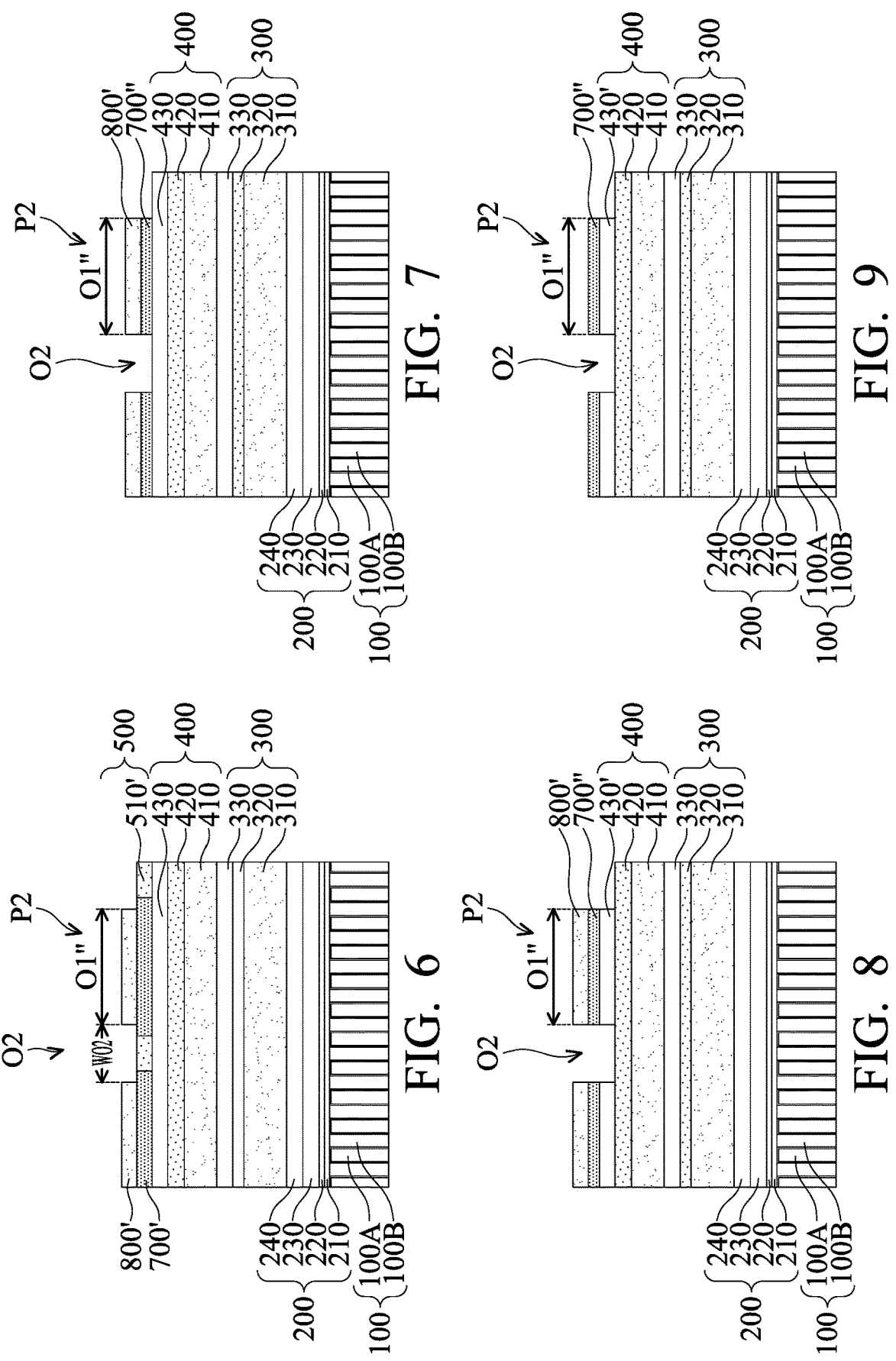

As shown in FIG. 6, the spacer material layer 700 is selectively removed until the first patterning layer 500 is exposed, and the second opening O2 is defined. Specifically, the spacer material layer 700 includes oxygen-containing materials and the carbon-containing material layer 800' includes carbon-containing materials. Thus, the spacer material layer 700 may be etched without substantially affecting the carbon-containing material layer 800' by having different etch ratios of selectivity to carbon and oxygen, and the second opening O2 at the recess between the carbon-containing material layers 800' is defined. At this time, the remaining spacer material layer 700 is denoted as 700', and the second opening O2 exposes the sidewalls of the carbon-containing material layer 800', and exposes a portion of the top surface of the spacer material layer 700' and the all of the top surfaces of the oxygen-containing mask layer 510'. The second pattern P2 has been formed at the first opening O1" (it should be noted that actually the first opening O1" has no opening (recess) and is only used to mark the position of the original first opening O1"), and the denotation of O1" still remains for the convenience of relative position comparison. In FIG. 6, the second opening O2 has a width WO2, which may be determined by the width of the trimmed first patterning photoresist layer 600' (see FIG. 2) and the thickness of both sides of the spacer material layer 700 (see FIG. 3).

As shown in FIG. 7, the spacer material layer 700' and the oxygen-containing mask layer 510' not covered by the carbon-containing material layer 800' are removed. That is, the second pattern P2 of the carbon-containing material layer 800' is transferred to the spacer material layer 700'. In some embodiments, since both the spacer material layer 700' and the oxygen-containing mask layer 510' are oxygen-containing materials (with similar materials), the exposed spacer material layer 700' and the oxygen-containing mask layer 510' are removed by the back etching process using the carbon-containing material layer 800' as a mask. At this point, the oxygen-containing mask layer 510' has been completely removed, the top surface of the oxygen-containing mask layer 430 is exposed, and the remaining spacer material layer 700' is denoted as 700". That is, the second opening O2 extends to the top surface of the oxygen-containing mask layer 430, and exposes sidewalls of the carbon-containing material layer 800' and sidewalls of the spacer material layer 700".

As shown in FIG. 8, the oxygen-containing mask layer 430 not covered by the carbon-containing material layer 800' is removed, and the second opening O2 extends to the top surface of the oxygen-containing mask layer 420. That is, the second pattern P2 of the carbon-containing material layer 800' is continuously transferred to the oxygen-containing mask layer 430. At this time, the oxygen-containing mask layer 430 is denoted as 430', and the second opening O2 exposes the sidewalls of the carbon-containing material layer 800', the sidewalls of the spacer material layer 700" and the sidewalls of the oxygen-containing mask layer 430'. In some embodiments, the transfer of the second pattern P2 may be performed by an etching process. It should be noted that, in some cases, the second opening O2 may extend to the oxygen-containing mask layer 420 without exposing the carbon-containing mask layer 410.

As shown in FIG. 9, the carbon-containing material layer 800' is removed. In some embodiments, the carbon-containing material layer 800' may be removed by an etch process with etch selectivity without substantially affecting the spacer material layer 700" and the oxygen-containing mask layer 430'.

As indicated above, and as shown in FIGS. 4-9, the first pattern reversal process reverses the first pattern P1" into the second opening O2, and reverses the first opening O1" into the second pattern P2.

As shown in FIG. 9-1, the first opening O1" is covered by the spacer material layer 700" and the second opening O2 exposes the oxygen-containing mask layer 420. That is, in FIG. 9-1, the spacer material layer 700" surrounds the oxygen-containing mask layer 420 in the second opening O2.

Figures 1, 9, 10, 11:
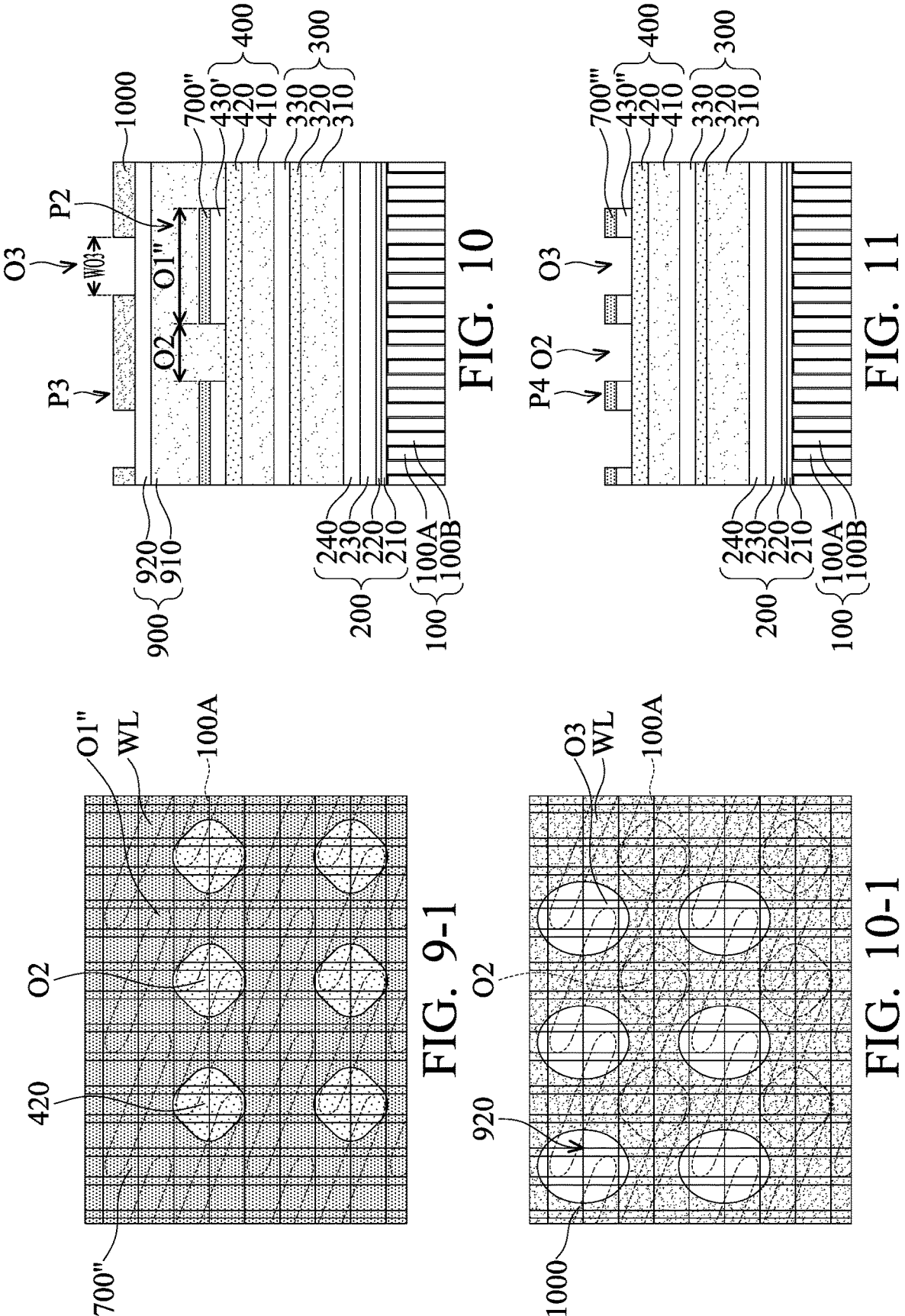

Next, refer to FIG. 10 and FIG. 10-1. As shown in FIG. 10, a second patterning layer 900 is formed in the second opening O2 and on the second opening O2. In some embodiments, the second patterning layer 900 includes a filling layer 910 formed in the second opening O2 and on the second opening O2 and a planarization layer 920 formed on the filling layer 910. The filling layer 910 has a thickness thick enough to completely cover the underlying spacer material layer 700" and oxygen-containing mask layer 430' in order to provide a substantially planar top surface for the planarization layer 920. The planarization layer 920 may be an anti-reflection coating layer to prevent the reflection of the underlying film during exposure and facilitate pattern transfer. The filling layer 910 may include a photoresist-like (PR-like) material, which may include a carbon-containing material or an oxygen-containing material, such as spin on carbon (SOC) or tetraethoxysilane (TEOS) oxide, or the like. The planarization layer 920 may be a spin on silicon anti-reflection coating (SOSA) or a silicon-containing hard-mask bottom anti-reflection coating (SHB). In some embodiments, the filling layer 910 and the planarization layer 920 may be sequentially deposited by a deposition process.

As shown in FIG. 10, a second patterning photoresist layer 1000 having a third opening O3 is formed on the second patterning layer 900. In FIG. 10, the third opening O3 has a width WO3. In some embodiments, the second patterning photoresist layer 1000 may be formed by a method similar to the method for forming the first patterning photoresist layer 600. In FIG. 10, the second patterning photoresist layer 1000 has a third pattern P3 and a third opening O3 exposing the underlying planarization layer 920. In some embodiments, the first patterning photoresist layer 600 and the second patterning photoresist layer 1000 may be formed by using the same mask, so as to reduce one photomask and reduce the process cost. That is, the pattern of the first patterning photoresist layer 600 and the pattern of the second patterning photoresist layer 1000 are the same. In other words, the untrimmed first pattern P1 is the same as the third pattern P3, and the first opening O1 of the first patterning photoresist layer 600 before trimming is the same as the third opening O3 of the second patterning photoresist layer 1000. That is, the width WO1 of the first opening O1 is the same as the width WO3 of the third opening O3.

As shown in FIG. 10-1, the third opening O3 of the second patterning photoresist layer 1000 exposes the planarization layer 920. The second patterning photoresist layer 1000 completely covers the second opening O2 (the second opening O2 is represented by a dotted line in FIG. 10-1). That is, in FIG. 10, the second patterning photoresist layer 1000 surrounds the planarization layer 920 in the third opening O3.

Figures 1, 12, 13:
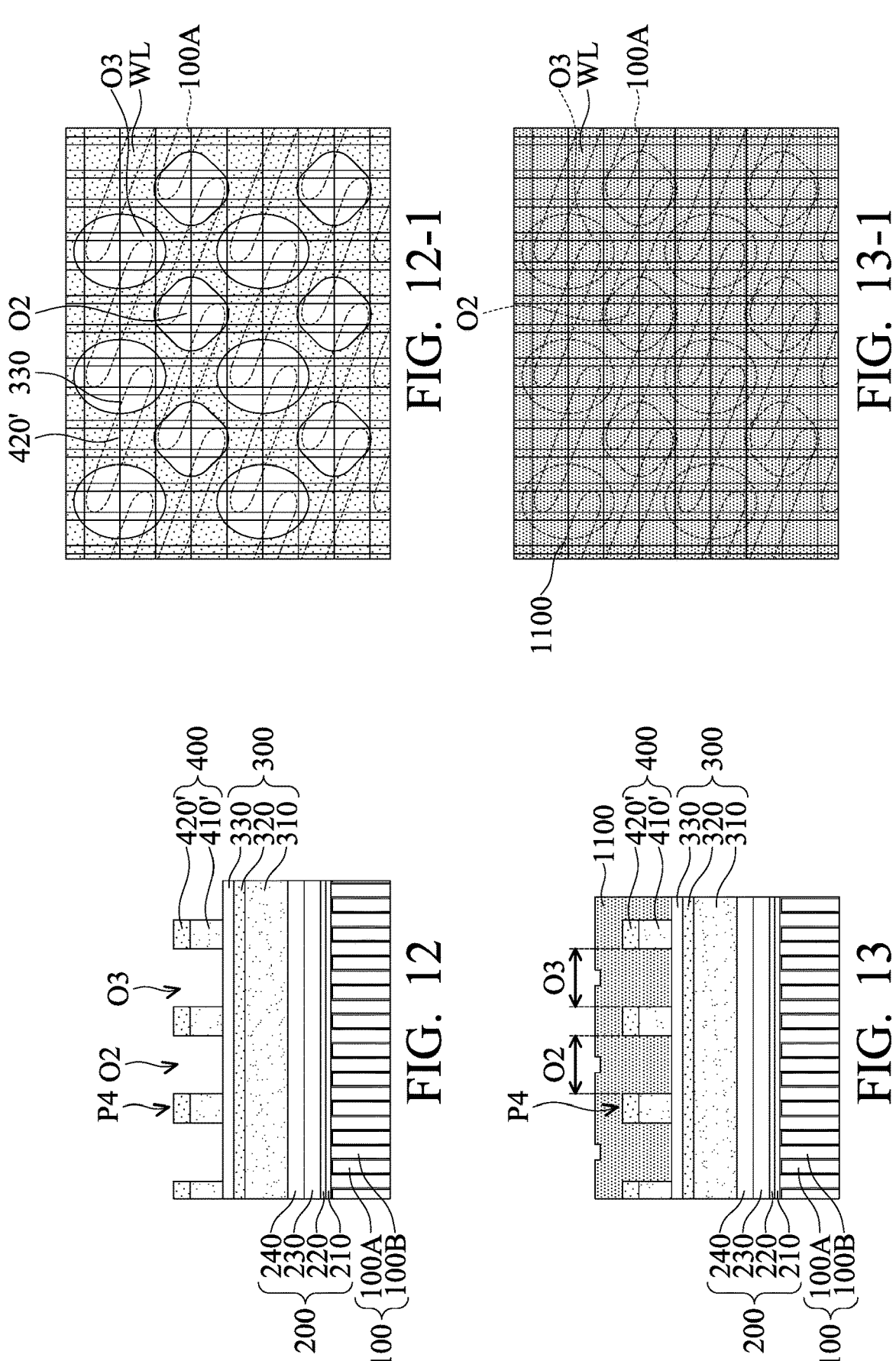

Referring to FIGS. 11-12 and FIG. 12-1, the third pattern P3 of the second patterning photoresist layer 1000 is transferred to the first stacking layer 400, so that the first stacking layer 400 has a second opening O2 and a third opening O3. That is, the third opening O3 of the second patterning photoresist 1000 extends to the first stacking layer 400, and the second patterning photoresist 1000 and the second patterning layer 900 are removed.

As shown in FIG. 11, the third opening O3 of the second patterning photoresist 1000 extends to the spacer material layer 700" and the oxygen-containing mask layer 430' by an etching process, and the second patterning photoresist layer 1000, planarization layer 920 and filling layer 910 are removed. At this time, the spacer material layer 700" and the oxygen-containing mask layer 430' are denoted as 700'" and 430", respectively. In some embodiments, the spacer material layer 700'" and the oxygen-containing mask layer 430" have a fourth pattern P4 and the second opening O2 and the third opening O3 exposing the underlying oxygen-containing mask layer 420.

Next, referring to FIGS. 12-15 and FIGS. 12-1, 13-1, and 14-1, a second pattern reversal process is performed to reverse the fourth pattern P4 between the second opening O2 and the third opening O3 into a fourth opening O4.

As shown in FIG. 12, the fourth pattern P4 is transferred to the carbon-containing mask layer 410 and the oxygen-containing mask layer 420. Specifically, the second opening O2 and the third opening O3 extend to the carbon-containing mask layer 410 and the oxygen-containing mask layer 420 through an etching process, and the spacer material layer 700'" and the oxygen-containing mask layer 430" are removed. Since both the spacer material layer 700'" and the oxygen-containing mask layer 430" include oxygen-containing materials, they may be removed together in the same step. At this time, the carbon-containing mask layer 410 and the oxygen-containing mask layer 420 are denoted as 410' and 420', respectively. In some embodiments, the carbon-containing mask layer 410' and the oxygen-containing mask layer 420' have a fourth pattern P4 and a second opening O2 and a third opening O3 exposing the underlying oxygen-containing mask layer 330.

As shown in FIG. 12-1, the second opening O2 and the third opening O3 expose the oxygen-containing mask layer 330. In FIG. 12-1, the oxygen-containing mask layer 420' surrounds the oxygen-containing mask layer 330 in the second opening O2 and the third opening O3. In some embodiments, along the extending direction perpendicular to the active region 100A, the second opening O2 and the third opening O3 are alternately arranged. Since the second opening O2 is obtained by trimming the first opening O1 and the first pattern reversal process, the shape of the second opening O2 and the shape of the third opening O3 are different. For example, the shape of the third opening O3 is rounder than that of the second opening O2.

As shown in FIG. 13, the oxygen-containing material layer 1100 is overfilled on the oxygen-containing mask layer 420'. As shown in FIG. 13-1, the oxygen-containing material layer 1100 covers the second opening O2 and the third opening O3 (the second opening O2 and the third opening O3 are represented by dotted lines in FIG. 13-1).

Figures 1, 14, 15, 16:
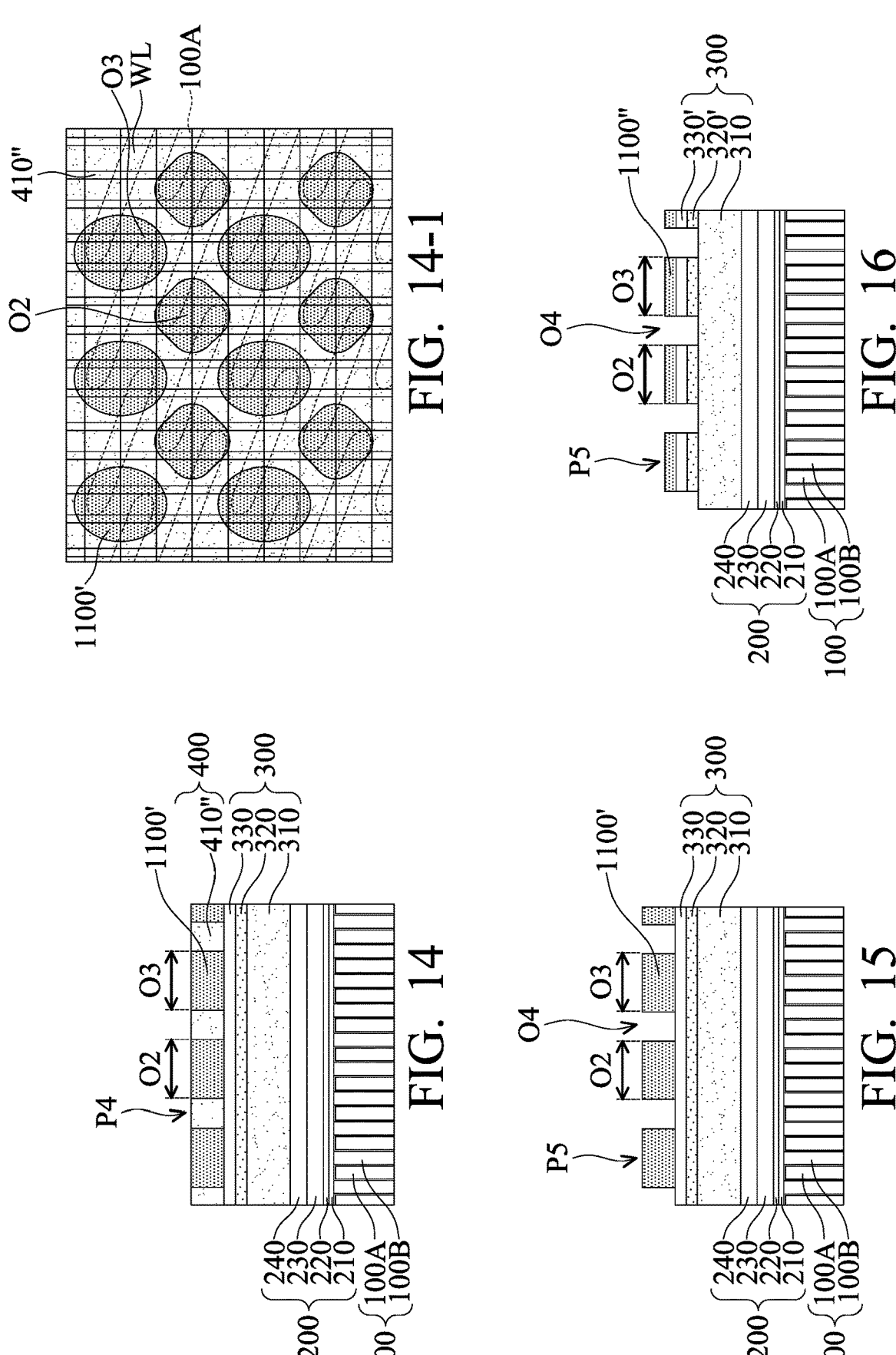

As shown in FIG. 14, a portion of the oxygen-containing material layer 1100 and the oxygen-containing mask layer 420' are removed to expose the carbon-containing mask layer 410', and the remaining oxygen-containing material layer 1100 is denoted as 1100'. In some embodiments, a portion of the carbon-containing mask layer 410' is also removed, and the remaining carbon-containing mask layer 410' is denoted as 410". That is, the oxygen-containing material layer 1100' is disposed in the second opening O2 and the third opening O3. Also, in a cross-sectional view, the carbon-containing mask layer 410" and the oxygen-containing material layer 1100' are alternately arranged. In some embodiments, the removing may include a planarization process or an etching process, so that the top surface of the oxygen-containing material layer 1100' is substantially coplanar with the top surface of the carbon-containing mask layer 410".

As shown in FIG. 14-1, the carbon-containing mask layer 410" surrounds the oxygen-containing material layer 1100' in the second opening O2 and the third opening O3.

As shown in FIG. 15, the carbon-containing mask layer 410" is removed to form a fourth opening O4 between the oxygen-containing material layer 1100' in the second opening O2 and the oxygen-containing material layer 1100' in the third opening O3. That is, the oxygen-containing material layer 1100' is disposed at the second opening O2 and the third opening O3, and has a fifth pattern P5 and a fourth opening O4 exposing the oxygen-containing mask layer 330. In some embodiments, the carbon-containing mask layer 410' may be removed by an etch process with etch selectivity without substantially affecting the oxygen-containing material layer 1100'.

As indicated above, and as shown in FIGS. 12-15, the second pattern reversal process reverses the fourth pattern P4 into the fourth opening O4, and reverses the second opening O2 and the third opening O3 into the fifth pattern P5.

Next, referring to FIGS. 16-21 and 21-1, the fourth opening O4 extends into the substrate 100 through the second stacking layer 300 and the cap layer 200.

As shown in FIG. 16, the fifth pattern P5 of the oxygen-containing material layer 1100' is transferred to the oxygen-containing mask layers 330 and 320. Specifically, using the oxygen-containing material layer 1100' as an etching mask, the fourth opening O4 extends to the oxygen-containing mask layers 330 and 320 through an etching process to expose the carbon-containing mask layer 310. At this time, the oxygen-containing mask layers 330 and 320 are denoted as 330' and 320', respectively. In some embodiments, since the materials of the oxygen-containing mask layers 330 and 320 are similar to those of the oxygen-containing material layer 1100', a portion of the oxygen-containing material layer 1100' is also removed during the transferring, and the remaining oxygen-containing material layer 1100' is denoted 1100".

As shown in FIG. 17, the fifth pattern P5 of the oxygen-containing mask layers 330' and 320' is transferred to the carbon-containing mask layer 310. Specifically, using the oxygen-containing mask layer 320' as an etching mask, the fourth opening O4 extends to the carbon-containing mask layer 310 through an etching process to expose the oxide layer 240. In some embodiments, the oxygen-containing material layer 1100', the oxygen-containing mask layer 330', and a portion of the oxygen-containing mask layer 320' may be removed together during the transferring. After transferring, the oxygen-containing mask layer 320' and the carbon-containing mask layer 310 are denoted as 320" and 310', respectively.

As shown in FIGS. 18-20, the fifth pattern P5 of the carbon-containing mask layer 310' is transferred to the substrate 100. Specifically, using the carbon-containing mask layer 310' as an etching mask, the fourth opening O4 extends to the oxide layer 240 (as shown in FIG. 18), the active layer 230 (as shown in FIG. 19), the oxide layer 220 and the nitride layer 210 (as shown in FIG. 20), and exposes the active region 100A in the substrate 100. In this embodiment, the fourth opening O4 further exposes a portion of the sidewall of the substrate 100. After transferring, the oxide layer 240, the active layer 230, the oxide layer 220, and the nitride layer 210 are denoted as 240', 230', 220', and 210', respectively.

Figures 1, 21, 22:
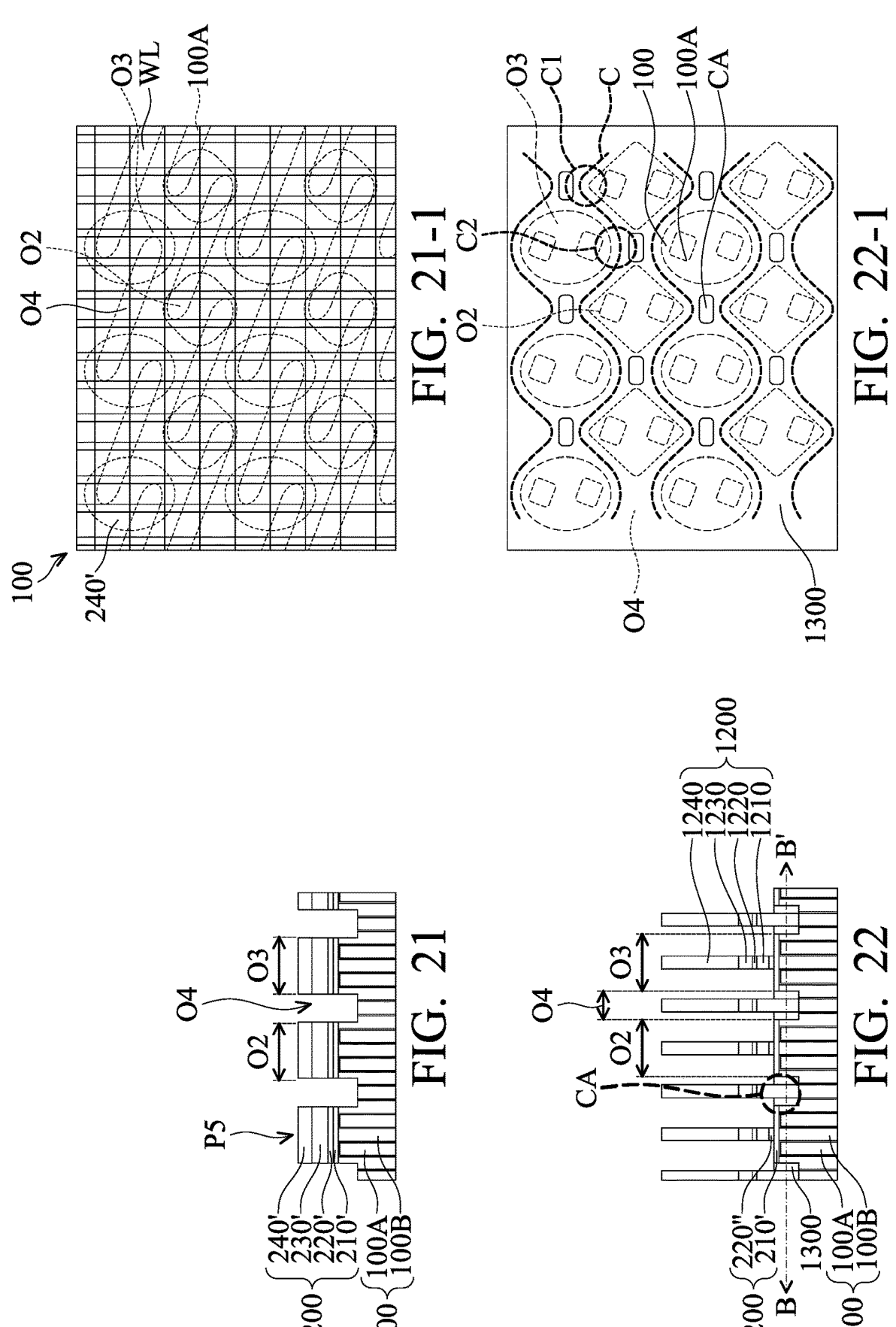

As shown in FIG. 21, the carbon-containing mask layer 310' is removed. Specifically, the carbon-containing mask layer 310' may be removed by a planarization process or an etching process without substantially affecting the cap layer 200.

As shown in FIG. 21-1, the substrate 100 with the fourth opening O4 surrounds the oxide layer 240' at the second opening O2 and the third opening O3 (In FIG. 12-1, the second opening O2 and the third opening O3 have no openings, and are only used to indicate the relative positions, so they are represented by dotted lines).

Next, after performing the following steps, the structure as shown in FIG. 21 and FIG. 22 may be obtained: forming a plurality of bit lines 1200 on the fourth opening O4; and forming a plurality of spacers 1300 on the sidewalls of the bit lines 1200.

Forming the bit lines 1200 on the fourth opening O4 includes: removing the oxide layer 240' by an etch process with etch selectivity; forming a bit line material layer (not shown) including a conductive layer and a dielectric layer by a deposition process; and patterning the bit line material layer by a patterning process (including lithography process and etching process) to form the bit lines 1200. Each of the bit lines 1200 includes conductive layers 1210, 1220 and 1230 and dielectric layer 1240. During patterning, the oxide layer 220' in the cap layer 200 is also patterned, and the remaining oxide layer 220' is denoted as 220".

In addition, the conductive layer 1210 disposed in the fourth opening O4 may be referred to as a bit line contact CA, and spacers 1300 are formed on both sides of the bit line contact CA to prevent the bit line contact from connecting the subsequent formed capacitor contact thereby shorted.

In some embodiments, the conductive layers 1210, 1220, and 1230 may include conductive materials. The conductive layer 1210 includes polysilicon, and the conductive layers 1220 and 1230 respectively include titanium nitride and tungsten. The dielectric layer 1240 may include dielectric materials such as oxides, oxynitrides, high-k dielectric materials, or other suitable dielectric materials. The dielectric layer 1240 may include silicon nitride.

By the cross-section line BB' in FIG. 22, the top view shown in FIG. 22-1 may be obtained. As shown in FIG. 22-1, the spacers 1300 surrounds the second opening O2 and the third opening O3. In some embodiments, the edge line C is drawn along the edge of the second opening O2 and the edge of the third opening O3, and the edge line C1 along the second opening O2 is sharper than the edge line C2 along the third opening O3. In some embodiments, each of the bit line contacts CA is disposed between two of the second openings O2 and two of the third openings O3.

It should be noted that additional components, such as dielectric liners (such as NON structures), capacitor contacts, capacitors, or the like, may still be formed after the formation of bit lines 1200 to complete memory elements (such as Dynamic Random Access Memory (DRAM)).

As mentioned above, compared with the comparative example in which the shapes of the second opening and the third opening are the same, the embodiments of the present invention make the shapes of the second opening and the third opening different through steps such as trimming. In the case, when electrical problems occur, errors in the process steps of the second opening or the third opening may be independently identified.

To sum up, the embodiment of the present invention uses two pattern reversal processes to define the bit line contacts in a scaling-down device. In addition, the embodiment of the present invention adjusts the size and shape of the second opening through trimming and the thickness of the spacer material layer, so as to be different from the third opening. In addition, the embodiments of the present invention may form openings of two different shapes by using the same mask with trimming, the manufacturing cost may be further reduced.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method, comprising:
sequentially forming a first stacking layer and a first patterning layer on a substrate;
forming a first patterning photoresist layer having a first opening on the first patterning layer;
trimming the first patterning photoresist layer;
transferring a first pattern of the trimmed first patterning photoresist layer to the first patterning layer;
performing a first pattern reversal process to reverse the first pattern of the first patterning layer into a second opening, wherein the second opening extends to the first stacking layer;
forming a second patterning layer in and on the second opening;
forming a second patterning photoresist layer having a third opening on the second patterning layer;
transferring a second pattern of the second patterning photoresist layer to the first stacking layer so that the first stacking layer has the second opening and the third opening;
performing a second pattern reversal process to reverse a third pattern between the second opening and the third opening into a fourth opening; and
extending the fourth opening to the substrate.

2. The method as claimed in claim 1, wherein the first pattern reversal process comprises:
conformally forming a spacer material layer on the first patterning layer and on the first stacking layer;
forming a carbon-containing material layer on the spacer material layer;
removing excess portions of the carbon-containing material layer to expose the spacer material layer; and
selectively removing the spacer material layer until the first patterning layer is exposed and defining the second opening.

3. The method as claimed in claim 2, wherein sidewalls of the second opening expose the carbon-containing material layer, and a bottom of the second opening exposes a portion of the spacer material layer and the first patterning layer.

4. The method as claimed in claim 2, wherein the first pattern reversal process further comprises:
removing the spacer material layer not covered by the carbon-containing material layer, the first patterning layer, and a portion of the first stacking layer, so as to extend the second opening to the first stacking layer and expose sidewalls of the spacer material layer and sidewalls of the first stacking layer; and
removing the carbon-containing material layer.

5. The method as claimed in claim 2, wherein the first stacking layer comprises a carbon-containing mask layer and an oxygen-containing mask layer on the carbon-containing mask layer, wherein extending the second opening to the first stacking layer comprises etching a portion of the oxygen-containing mask layer without exposing the carbon-containing mask layer.

6. The method as claimed in claim 2, wherein the spacer material layer comprises an oxygen-containing material.

7. The method as claimed in claim 1, wherein the second pattern reversal process comprises:

forming an oxygen-containing material layer in the second opening and in the third opening; and removing the first stacking layer to form the fourth opening between the oxygen-containing material layer in the second opening and the oxygen-containing material layer in the third opening.

8. The method as claimed in claim 7, wherein the first stacking layer comprises a carbon-containing mask layer and an oxygen-containing mask layer disposed on the carbon-containing mask layer, wherein forming the oxygen-containing material layer and removing the first stacking layer comprises:

overfilling the oxygen-containing material layer on the oxygen-containing mask layer;

removing a portion of the oxygen-containing material layer and the oxygen-containing mask layer to expose the carbon-containing mask layer; and removing the carbon-containing mask layer to form the fourth opening between the oxygen-containing material layer in the second opening and the oxygen-containing material layer in the third opening.

9. The method as claimed in claim 1, wherein forming the first patterning photoresist layer comprises patterning a first photoresist layer using a first mask to form the first patterning photoresist layer, wherein forming the second patterning photoresist layer comprises patterning a second photoresist layer using a second mask to form the second patterning photoresist layer, wherein the first mask is the same as the second mask.

10. The method as claimed in claim 1, wherein a width of the first opening of the first patterning photoresist layer is the same as a width of the third opening of the second patterning photoresist layer.

11. The method as claimed in claim 1, wherein trimming the first patterning photoresist layer comprises isotropically etching the first patterning photoresist layer, and reducing a height of the first patterning photoresist layer.

12. The method as claimed in claim 1, wherein in a top view, the trimmed first patterning photoresist layer is rhombus-shaped.

13. The method as claimed in claim 1, wherein in a top view, a shape of the second opening is different from that of the third opening.

14. The method as claimed in claim 1, wherein in a top view, a shape of the third opening is rounder than a shape of the second opening.

15. The method as claimed in claim 1, wherein the second opening and the third opening are alternately arranged along an extending direction perpendicular to an active region.

16. The method as claimed in claim 1, wherein an edge line is drawn along an edge of the second opening and an edge of the third opening, wherein the edge line along the second opening is sharper than the edge line along the third opening.

17. The method as claimed in claim 1, wherein the substrate includes an active region, wherein extending the fourth opening to the substrate comprises extending the fourth opening to the active region.

18. The method as claimed in claim 1, further comprising:

forming a second stacking layer and a cap layer between the first stacking layer and the substrate;

extending a fourth opening to the substrate through the second stacking layer and the cap layer; and removing the second stacking layer.

19. The method as claimed in claim 1, further comprising:

forming bit lines on the fourth opening; and forming spacers on sidewalls of the bit lines.

20. The method as claimed in claim 1, wherein the one of the bit lines comprises a bit line contact, wherein the bit line contact is disposed in the fourth opening.

* * * * *